US012757755B2

(12) United States Patent
Niu et al.

(10) Patent No.: US 12,757,755 B2
(45) Date of Patent: Oct. 6, 2026

(54) SEMICONDUCTOR PACKAGE HAVING LEAD FRAME WITH SLANTED SECTIONS

(71) Applicant: ALPHA AND OMEGA SEMICONDUCTOR INTERNATIONAL LP, Toronto (CA)

(72) Inventors: Zhiqiang Niu, Santa Clara, CA (US); Xiao Zhang, Sunnyvale, CA (US); Long-Ching Wang, Cupertino, CA (US); Guobing Shen, Shanghai (CN); Yan Xun Xue, Los Gatos, CA (US)

(73) Assignee: ALPHA AND OMEGA SEMICONDUCTOR INTERNATIONAL LP, Toronto (CA)

( * ) Notice: Subject to any disclaimer, the term of this patent is extended or adjusted under 35 U.S.C. 154(b) by 381 days.

(21) Appl. No.: 18/375,388

(22) Filed: Sep. 29, 2023

(65) Prior Publication Data

US 2025/0112132 A1 Apr. 3, 2025

(51) Int. Cl.

*H10W 70/40* (2026.01)
*H10W 74/10* (2026.01)
*H10W 90/00* (2026.01)

(52) U.S. Cl.

CPC ........ *H10W 70/481* (2026.01); *H10W 74/111* (2026.01); *H10W 90/755* (2026.01)

(58) Field of Classification Search

CPC ............. H10W 70/481; H10W 74/111; H10W 90/755; H01L 23/3107; H01L 23/49548; H01L 23/49562; H01L 2224/48175

See application file for complete search history.

(56) References Cited

U.S. PATENT DOCUMENTS

| | | | | |
|---|---|---|---|---|
| 10,204,845 B2 * | 2/2019 | Otremba | ............. | H10W 70/411 |
| 2010/0133670 A1 * | 6/2010 | Liu | ..................... | H10W 70/461 438/122 |
| 2020/0273838 A1 * | 8/2020 | Williams | ............. | H05K 3/3426 |

* cited by examiner

*Primary Examiner* — Fernando L Toledo
*Assistant Examiner* — Jorge Andres Lopez
(74) *Attorney, Agent, or Firm* — Chen-Chi Lin

(57) ABSTRACT

A semiconductor package comprises a lead frame, a chip, and a molding encapsulation. The lead frame comprises a top plate, a plurality of drain pads, a plurality of slanted sections, a gate pad, and a plurality of source pads. The top plate of the lead frame comprises a thicker region and a thinner region. Each slanted section of the plurality of slanted sections connects a respective drain pad of the plurality of drain pads to the top plate. A respective side surface of each drain pad of the plurality of drain pads is exposed from a side surface of the molding encapsulation. A respective bottom surface of each drain pad of the plurality of drain pads is exposed from a bottom surface of the molding encapsulation. A top surface of the thicker region is exposed from a top surface of the molding encapsulation.

20 Claims, 4 Drawing Sheets

SEMICONDUCTOR PACKAGE HAVING LEAD FRAME WITH SLANTED SECTIONS

FIELD OF THE INVENTION

This invention relates generally to a semiconductor package having lead frame with slanted sections. More particularly, the present invention relates to the semiconductor package having portions of the lead frame exposed from top, side, and bottom surfaces of a molding encapsulation.

BACKGROUND OF THE INVENTION

The performance of a dual flat no lead (DFN) package depends on the heat dissipation capacity. An optimized lead frame design may reduce the manufacturing cost of the semiconductor package.

The advantages of present disclosure include a first portion of the lead frame exposed from the top surface of the molding encapsulation facilitating heat dissipation; and a second portion of the lead frame exposed from the side surfaces and the bottom surface of the molding encapsulation facilitating wettability in a solder reflow process. An etched area of a top plate of the lead frame improves the integration between the top plate of the lead frame and the molding encapsulation. A plurality of bond wire connections improves the current carrier capability. A lead frame strip, during a manufacturing process, extrudes tie bars so as to provide sufficient high voltage creep distance.

SUMMARY OF THE INVENTION

The present invention discloses a semiconductor package comprising a lead frame, a chip, and a molding encapsulation. The lead frame comprises a top plate, a plurality of drain pads, a plurality of slanted sections, a gate pad, and a plurality of source pads. The top plate of the lead frame comprises a thicker region and a thinner region. Each slanted section of the plurality of slanted sections connects a respective drain pad of the plurality of drain pads to the top plate. The chip is flipped and attached to the lead frame. The drain electrode of the chip is attached to a bottom surface of the top plate of the lead frame.

A respective side surface of each drain pad of the plurality of drain pads is exposed from a side surface of the molding encapsulation. A respective bottom surface of each drain pad of the plurality of drain pads is exposed from a bottom surface of the molding encapsulation. A top surface of the thicker region of the top plate of the lead frame is exposed from a top surface of the molding encapsulation.

DETAILED DESCRIPTION OF THE INVENTION

Figure 1A:
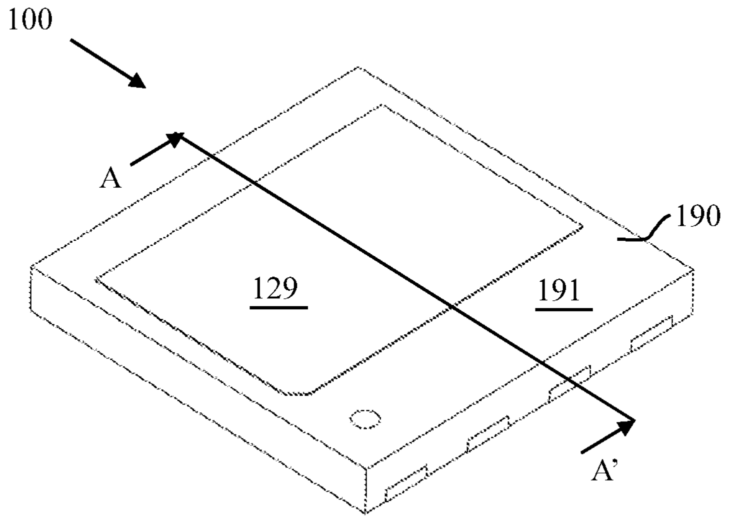
FIG. 1A is a top perspective view.
Figure 1B:
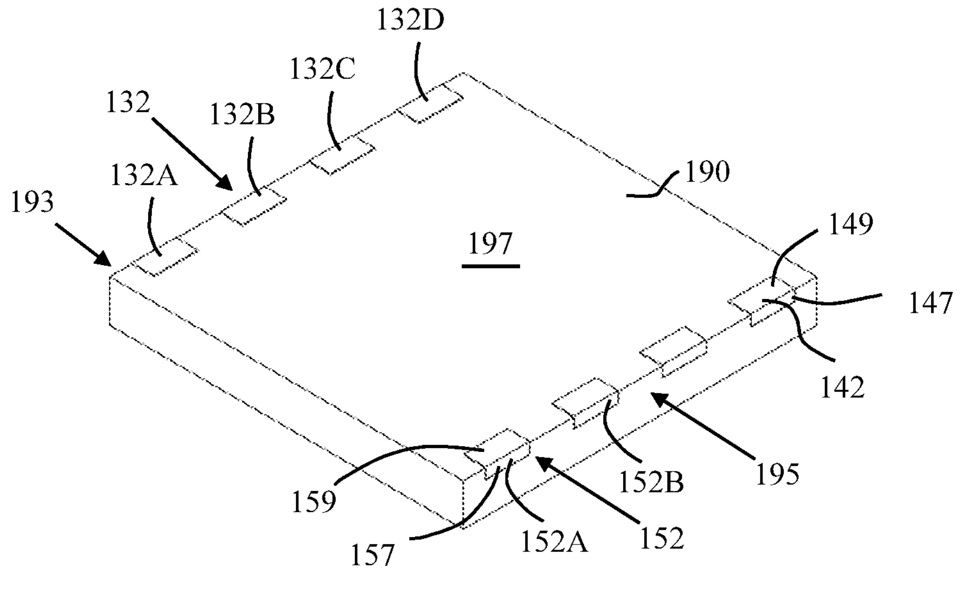
FIG. 1B is a bottom perspective view.
Figure 1C:
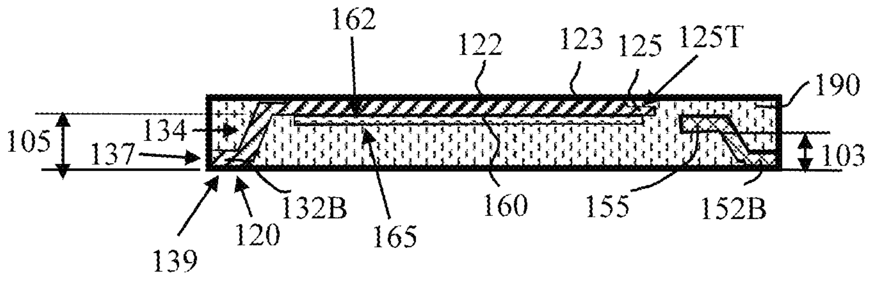
FIG. 1C is a cross-sectional view from AA' of a semiconductor package in examples of the present disclosure.

FIG. 1A is a top perspective view, FIG. 1B is a bottom perspective view, and FIG. 1C is a cross-sectional view from AA' of FIG. 1A of a semiconductor package 100 in examples of the present disclosure. In one example, the semiconductor package 100 is of a rectangular prism shape. In examples of the present disclosure, a width of the semiconductor package is in a range from 4 mm to 10 mm. A length of the semiconductor package is in a range from 4 mm to 10 mm. The semiconductor package 100 comprises a lead frame 120, a chip 160, and a molding encapsulation 190. The lead frame 120 comprises a top plate 122, a plurality of drain pads 132, a plurality of slanted sections 134, a gate pad 142, and a plurality of source pads 152. The top plate 122 of the lead frame 120 comprises a thicker region 123 and a thinner region 125. In one example, the plurality of drain pads 132 comprises four drain pads, that is, drain pad 132A, drain pad 132B, drain pad 132C, and drain pad 132D. The number of drain pads may vary. In another example, the plurality of source pads 152 comprises two source pads, that is, source pad 152A and source pad 152B. The number of source pads may vary.

Each slanted section of the plurality of slanted sections 134 connects a respective drain pad of the plurality of drain pads 132 to the top plate 122.

The chip 160 is attached to the lead frame 120. In one example, the drain electrode 162 of the chip 160 is attached to a bottom surface of the top plate 122 of the lead frame 120. The chip 160 comprises a source electrode 165 and a gate electrode 263 of FIG. 2 on a top surface of the chip 160; and a drain electrode 162 on a bottom surface of the chip 160.

The molding encapsulation 190 encloses the chip 160 and a majority portion of the lead frame 120. The plain meaning of the word "majority" is larger than 50%. The molding encapsulation 190 comprises a top surface 191, a first side surface 193, a second side surface 195 opposite the first side surface 193; and a bottom surface 197. The bottom surface 197 of the molding encapsulation 190 extends from a central area to all side surfaces of the molding encapsulation 190.

A respective side surface (for example, side surface 137) of each drain pad of the plurality of drain pads 132 is exposed from and coplanar to the first side surface 193 of the molding encapsulation 190. A respective bottom surface (for example, bottom surface 139) of each drain pad of the plurality of drain pads 132 is exposed from and coplanar to the bottom surface 197 adjacent the first side surface 195 of the molding encapsulation 190. A top surface 129 of the thicker region 123 of the top plate 122 of the lead frame 120 is exposed from the top surface 191 of the molding encapsulation 190. A side surface 147 of the gate pad 142 is exposed from and coplanar to the second side surface 195 of the molding encapsulation 190. A bottom surface 149 of the gate pad 142 is exposed from and coplanar to the bottom surface 197 adjacent the second side surface 195 of the molding encapsulation 190. A respective side surface (for example, side surface 157) of each source pad of the plurality of source pads 152 is exposed from and coplanar to the second side surface 195 of the molding encapsulation 190. A respective bottom surface (for example, bottom surface 159) of each source pad of the plurality of source pads 152 is exposed from and coplanar to the bottom surface 197 adjacent the second side surface 195 of the molding encapsulation 190. As shown in FIGS. 1A and 1B, side surfaces of the molding encapsulation 190 perpendicular to the first side surface 193 of the molding encapsulation 190 are completely covered by the molding encapsulation 190 without die bars exposed.

In examples of the present disclosure, a top surface 125T of the thinner region 125 of the top plate 122 of the lead frame 120 is recessed from a top surface of the thicker region 123 of the top plate 122 and is not exposed from the top surface 191 of the molding encapsulation 190.

A respective height 103 between the respective bottom surface of each source pad (for example, source pad 152B) of the plurality of source pads 152 and a bottom surface of the source connection plate 155 is in a range from 0.3 mm to 1.0 mm. The height 103 is required for accommodating the plurality of bond wires 329 of FIG. 3A.

A respective height 105 between the respective bottom surface of each drain pad (for example, drain pad 132B) of the plurality of drain pads 132 and a bottom surface of the top plate 122 of the lead frame 120 is in a range from 0.5 mm to 1.2 mm. In one example, height 105 is larger than height 103 by at least a thickness of the chip 160. In another example, bottom surface of the top plate 122 and top surface of the source connection plate 155 are coplanar. In yet another example, bottom surface of the source connection plate 155 is coplanar to the source and gate electrodes disposed on the top surface of the chip 160.

A thickness of the top plate 122 of the lead frame 120 is in a range from 0.2 mm to 0.4 mm. A thickness of the thinner region 125 of the top plate 122 of the lead frame 120 is 50% of a thickness of the thicker region 123 of the top plate 122 of the lead frame 120. In one example, the thicker region 123 of the top plate 122 of the lead frame 120 is of "full thickness." The thinner region 125 of the top plate 122 of the lead frame 120, formed by an etching process, is of "half thickness." In one example, the half etched thinner region 125 is formed at an edge of the top plate 122 close to the source connection plate 155. In another example, the half etched thinner region 125 is formed at all edges of the top plate 122.

Figure 2:
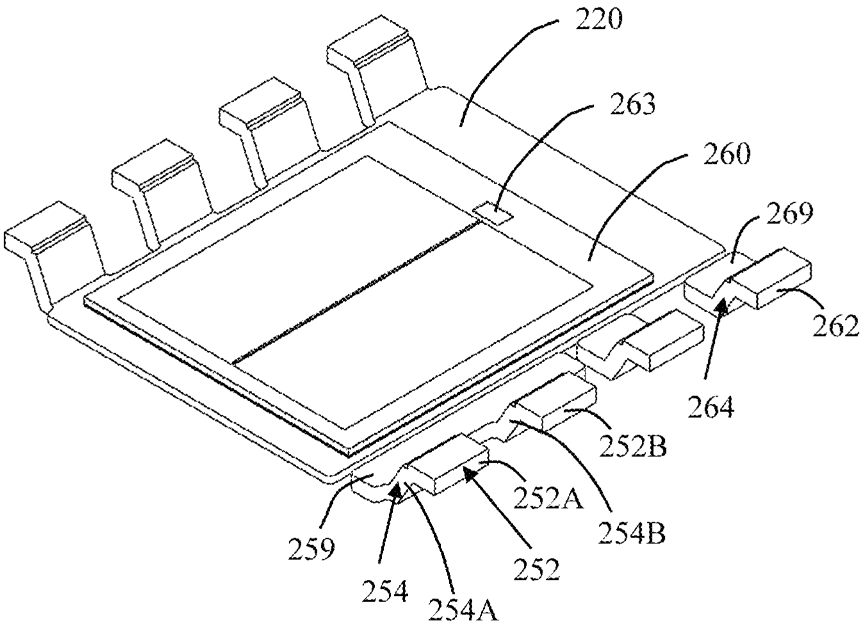
FIG. 2 is a bottom perspective view of a chip and a lead frame in examples of the present disclosure.

FIG. 2 is a bottom perspective view of a chip 260 and a lead frame 220 in examples of the present disclosure. The lead frame 220 comprises a plurality of source pads 252, a source connection plate 259 and a plurality of source connection slanted sections 254. Each of the plurality of source connection slanted sections 254 connect a respective source pad of the plurality of source pads 252 to the source connection plate 259. In examples of the present disclosure, the plurality of source pads 252 comprises two source pads, that is, source pad 252A and source pad 252B. The number of source pads may vary. In examples of the present disclosure, the plurality of source connection slanted sections 254 comprises two source connection slanted section, that is, source connection slanted section 254A and source connection slanted section 254B. The number of source connection slanted sections may vary.

The lead frame 220 further comprises a gate pad 262, a gate connection plate 269, and a gate connection slanted section 264. The gate connection slanted section 264 connects the gate pad 262 to the gate connection plate 269.

Figure 3A:
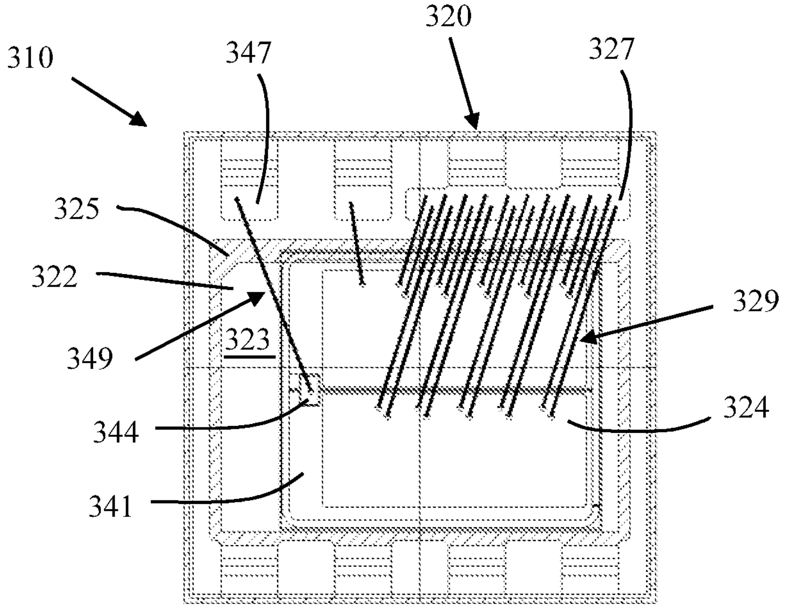
FIG. 3A is a bottom view of a semiconductor package in examples of the present disclosure.
Figure 3B:
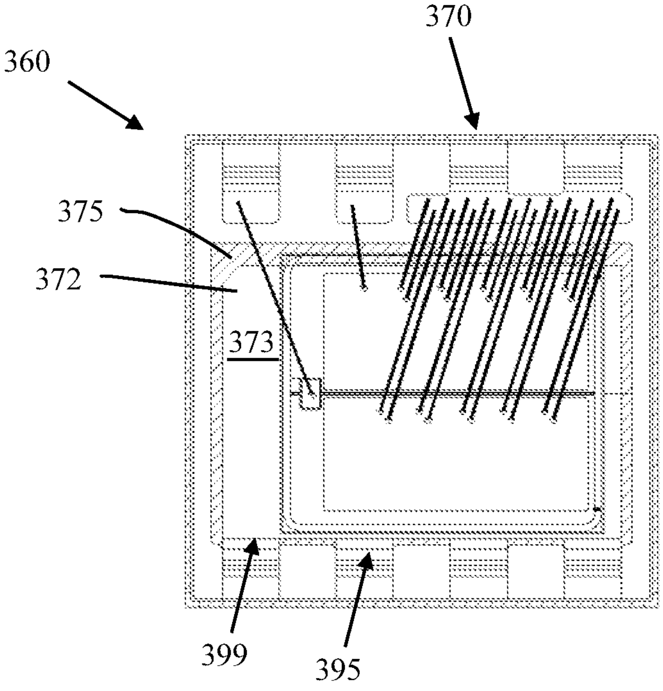
FIG. 3B is a bottom view of another semiconductor package in examples of the present disclosure.

FIG. 3A is a bottom view of a semiconductor package 310 in examples of the present disclosure. FIG. 3B is a bottom view of another semiconductor package 360 in examples of the present disclosure. A gate connection bond wire 349 connects the gate electrode 344 of the chip 341 to the gate connection plate 347 of the lead frame 320.

A plurality bond wires 329 connect the source electrode 324 of the chip 341 to a source connection plate 327 of the lead frame 320.

In FIG. 3A, the hatched area (thinner region 325) of the top plate 322 represents the thinner region 325 of the top plate 322. The thinner region 325 increases contact areas between the top plate 322 and molding encapsulation 190 of FIG. 1A thereby improving the integration between the top plate 322 and molding encapsulation 190 of FIG. 1A. The thinner region 325 of the top plate 322 of the lead frame 320 is disposed at a peripheral region of the top plate 322 of the lead frame 320. An entirety of the thicker region 323 of the top plate 322 of the lead frame 320 is surrounded by the thinner region 325 of the top plate 322 of the lead frame 320. In one example, a top surface of the thinner region 325 of the top plate 322 of the lead frame 320 is of a hollow rectangle shape. A top surface of the thinner region 325 of the top plate 322 of the lead frame 320 directly contacts the molding encapsulation 190.

In FIG. 3B, the hatched area (thinner region 375) of the top plate 372 represents the thinner region 375 of the top plate 372. An entirety of the thicker region 373 of the top plate 372 of the lead frame 370 is surrounded by the thinner region 375 of the top plate 372 of the lead frame 370 except for a plurality of horizontal regions 399 connected to the plurality of slanted sections 391 of the lead frame 370.

Figure 4:
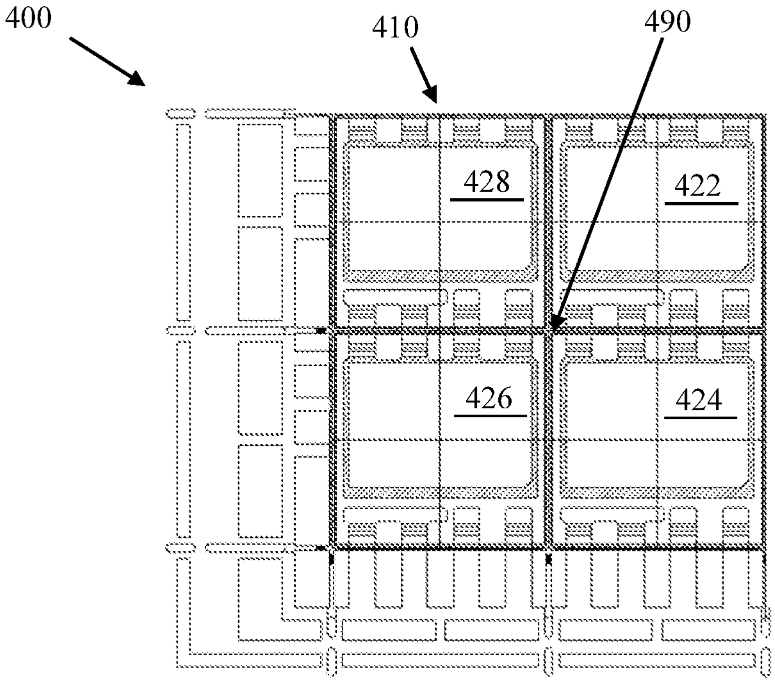
FIG. 4 is a bottom view of a lead frame strip in examples of the present disclosure.

FIG. 4 is a bottom view of a lead frame strip 400 in examples of the present disclosure. The lead frame strip 400 comprises a plurality of lead frames 410 and a plurality of side rails 490. The lead frame strip 400 does not include tie bars. In one example, the plurality of lead frames 410 comprises four lead frames, that is, lead frame 422, lead frame 424, lead frame 426, and lead frame 428. The number of lead frames in a lead frame strip may vary. After a singulation process, the lead frame 422, the lead frame 424, the lead frame 426, and the lead frame 428 are separated from one another.

Those of ordinary skill in the art may recognize that modifications of the embodiments disclosed herein are possible. For example, a number of the plurality of bond wires may vary. Other modifications may occur to those of ordinary skill in this art, and all such modifications are deemed to fall within the purview of the present invention, as defined by the claims.

The invention claimed is:

1. A semiconductor package comprising:

a lead frame comprising
- a top plate comprising:
  - a thicker region; and
  - a thinner region;
- a plurality of drain pads;
- a plurality of slanted sections, each slanted section of the plurality of slanted sections connecting a respective drain pad of the plurality of drain pads to the top plate;
- a gate pad; and
- a plurality of source pads;

a chip attached to the lead frame, the chip comprising:
- a source electrode and a gate electrode on a top surface of the chip; and
- a drain electrode on a bottom surface of the chip;

a molding encapsulation enclosing the chip and a majority portion of the lead frame, the molding encapsulation comprises:
- a top surface;
- a first side surface;
- a second side surface opposite the first side surface; and
- a bottom surface;

wherein a respective side surface of each drain pad of the plurality of drain pads is exposed from the first side surface of the molding encapsulation;

wherein a respective bottom surface of each drain pad of the plurality of drain pads is exposed from the bottom surface of the molding encapsulation;

wherein a top surface of the thicker region of the top plate of the lead frame is exposed from the top surface of the molding encapsulation;

wherein a side surface of the gate pad is exposed from the second side surface of the molding encapsulation;

wherein a bottom surface of the gate pad is exposed from the bottom surface of the molding encapsulation;

wherein a respective side surface of each source pad of the plurality of source pads is exposed from the second side surface of the molding encapsulation; and wherein a respective bottom surface of each source pad of the plurality of source pads is exposed from the bottom surface of the molding encapsulation.

2. The semiconductor package of claim 1, wherein the drain electrode of the chip is attached to a bottom surface of the top plate of the lead frame.

3. The semiconductor package of claim 2 further comprising:

a gate connection bond wire connecting the gate electrode of the chip to a gate connection plate of the lead frame; and a plurality bond wires connecting the source electrode of the chip to a source connection plate of the lead frame.

4. The semiconductor package of claim 1, wherein a top surface of the thinner region of the top plate of the lead frame is not exposed from the top surface of the molding encapsulation.

5. The semiconductor package of claim 1, wherein the lead frame further comprises:

a source connection plate; and a plurality of source connection slanted sections;

wherein each of the plurality of source connection slanted sections connects a respective source pad of the plurality of source pads to the source connection plate.

6. The semiconductor package of claim 5, wherein a respective height between the respective bottom surface of each source pad of the plurality of source pads and a bottom surface of the source connection plate is in a range from 0.3 millimeter to 1.0 millimeter.

7. The semiconductor package of claim 6, wherein the lead frame further comprises:

a gate connection plate; and a gate connection slanted section;

wherein the gate connection slanted section connects the gate pad to the gate connection plate.

8. The semiconductor package of claim 1, wherein a respective height between the respective bottom surface of each drain pad of the plurality of drain pads and a bottom surface of the top plate of the lead frame is in a range from 0.5 millimeter to 1.2 millimeters.

9. The semiconductor package of claim 1, wherein a thickness of the top plate of the lead frame is in a range from 0.2 millimeter to 0.4 millimeter.

10. The semiconductor package of claim 9, wherein a thickness of the thinner region of the top plate of the lead frame is 50% of a thickness of the thicker region of the top plate of the lead frame.

11. The semiconductor package of claim 1, wherein the thinner region of the top plate of the lead frame is disposed at a peripheral region of the top plate of the lead frame.

12. The semiconductor package of claim 11, wherein an entirety of the thicker region of the top plate of the lead frame is surrounded by the thinner region of the top plate of the lead frame.

13. The semiconductor package of claim 12, wherein a top surface of the thinner region of the top plate of the lead frame is of a hollow rectangle shape.

14. The semiconductor package of claim 12, wherein a top surface of the thinner region of the top plate of the lead frame directly contacts the molding encapsulation.

15. The semiconductor package of claim 11, wherein an entirety of the thicker region of the top plate of the lead frame is surrounded by the thinner region of the top plate of the lead frame except for a plurality of horizontal regions connected to the plurality of slanted sections of the lead frame.

16. The semiconductor package of claim 15, wherein a top surface of the thinner region of the top plate of the lead frame is of a hollow rectangle shape except for a plurality of horizontal areas connected to the plurality of slanted sections of the lead frame.

17. The semiconductor package of claim 1, wherein the lead frame further comprises;

a source connection plate; and wherein the thinner region of the top plate of the lead frame is only disposed at an edge of the top plate close to the source connection plate.

18. The semiconductor package of claim 1, wherein the lead frame further comprises;

a source connection plate; and wherein a bottom surface of the top plate and a top surface of the source connection plate are coplanar.

19. The semiconductor package of claim 1, wherein the lead frame further comprises;

a source connection plate; and wherein a bottom surface of the source connection plate is coplanar to the source electrode and the gate electrode disposed on the top surface of the chip.

20. The semiconductor package of claim 1, an entirety of the lead frame is one of a plurality of lead frames simulated from a same lead frame strip.

* * * * *